US008916821B2

(12) United States Patent
Ferrara et al.

(10) Patent No.: US 8,916,821 B2
(45) Date of Patent: Dec. 23, 2014

(54) ASSEMBLIES FOR ION AND ELECTRON SOURCES AND METHODS OF USE

(75) Inventors: Keith Ferrara, Stratford, CT (US); David Barkus, Oakville, CT (US); Adam Patkin, Hamden, CT (US); Rosario Mannino, North Haven, CT (US); Daniel Pentek, Hamden, CT (US); Frank Delorenzo, Stratford, CT (US); Barton Rasmussen, Newtown, CT (US)

(73) Assignee: Perkinelmer Health Sciences, Inc., Waltham, MA (US)

( * ) Notice: Subject to any disclaimer, the term of this patent is extended or adjusted under 35 U.S.C. 154(b) by 663 days.

(21) Appl. No.: 12/902,391

(22) Filed: Oct. 12, 2010

(65) Prior Publication Data

US 2011/0089333 A1 Apr. 21, 2011

Related U.S. Application Data

(60) Provisional application No. 61/250,619, filed on Oct. 12, 2009.

(51) Int. Cl.

*H01J 49/06* (2006.01)
*H01J 3/38* (2006.01)
*H01J 37/02* (2006.01)
*H01J 49/10* (2006.01)
*H01J 27/02* (2006.01)

(52) U.S. Cl.

CPC ................. *H01J 49/068* (2013.01); *H01J 3/38* (2013.01); *H01J 49/10* (2013.01); *H01J 27/022* (2013.01)
USPC .................... 250/288; 250/423 R; 250/396 R

(58) Field of Classification Search

CPC ......... H01J 49/06; H01J 49/068; H01J 3/027; H01J 3/028; H01J 3/04; H01J 3/38; H01J 27/022; H01J 29/02; H01J 29/485; H01J 29/487; H01J 29/82; H01J 37/02; H01J 37/023; H01J 37/065; H01J 37/067; H01J 37/08; H01J 2237/032
USPC .......................................................... 250/288
IPC ............................................ H01J 49/06, 49/068
See application file for complete search history.

(56) References Cited

U.S. PATENT DOCUMENTS 2,458,962 A 1/1949 Shelton
2,507,331 A 5/1950 Henri
2,581,446 A 1/1952 Robinson
3,694,687 A 9/1972 Glenn
3,801,788 A 4/1974 Milne
3,854,832 A * 12/1974 Cowper ........................ 403/349

(Continued)

FOREIGN PATENT DOCUMENTS

DE 914532 7/1954
GB 2161019 1/1986

(Continued)

*Primary Examiner* — Jack Berman
(74) *Attorney, Agent, or Firm* — Rhodes IP PLC; Christopher R Rhodes

(57) ABSTRACT

Certain embodiments described herein are directed to devices that can be used to align the components of a source assembly in a source housing. In some examples, a terminal lens configured to couple to the housing through respective alignment features can be used to retain the source components in a source housing to provide a source assembly.

25 Claims, 9 Drawing Sheets

(56) References Cited

U.S. PATENT DOCUMENTS

| | | | | |
|---|---|---|---|---|
| 4,447,728 | A * | 5/1984 | Stafford et al. | 250/423 R |
| 4,531,056 | A | 7/1985 | Labowsky | |
| 6,294,780 | B1 * | 9/2001 | Wells et al. | 250/288 |
| 6,362,486 | B1 | 3/2002 | Into | |
| 7,265,368 | B2 * | 9/2007 | Martin, III | 250/492.3 |

FOREIGN PATENT DOCUMENTS

| | | |
|---|---|---|
| JP | 05-251031 | 9/1993 |
| JP | 06-060837 | 3/1994 |
| JP | 06-35983 | 5/1994 |
| JP | 11086767 | 6/1999 |
| JP | 11-201902 | 7/1999 |
| JP | 2001-503556 | 3/2001 |
| JP | 2002-150993 | 5/2002 |
| JP | 2004-134321 | 4/2004 |
| JP | 2007-510263 | 4/2007 |
| WO | 9852682 | 11/1998 |
| WO | 2005043579 | 5/2005 |
| WO | 2009123914 | 10/2009 |

* cited by examiner

ASSEMBLIES FOR ION AND ELECTRON SOURCES AND METHODS OF USE

PRIORITY APPLICATION

This application is a non-provisional application of, and claims priority to, U.S. Provisional Application No. 61/250,619 filed on Oct. 12, 2009, the entire disclosure of which is hereby incorporated herein by reference for all purposes.

TECHNOLOGICAL FIELD

This application is related to ion and electron sources and methods using them. In particular, certain embodiments described herein are directed to components for use in assembling ion sources and/or electron sources.

BACKGROUND

Many devices use an ion source or an electron source to provide ions or particles. During use of the source it may become contaminated with sample, or other unwanted species can accumulate on the source components potentially resulting in poor performance or analysis errors.

SUMMARY

In a first aspect, a source assembly comprising a housing configured to receive source components, the housing comprising a first integral alignment feature is provided. In certain examples, the source assembly can also include a terminal lens configured to provide a beam, the terminal lens comprising a second integral alignment feature and constructed and arranged to couple to the housing when the first integral alignment feature is coupled to the second integral alignment feature to align the terminal lens with the source components in the housing and retain the source components in the housing.

In another aspect, a source assembly comprising a housing configured to receive source components and comprising a first set of integral alignment features is provided. In certain embodiments, the source assembly can include a terminal lens constructed and arranged to provide a beam, the terminal lens comprising a second set of integral alignment features and constructed and arranged to couple to the housing when the first set of integral alignment features are coupled to the second set of integral alignment features to align the terminal lens with the source components in the housing and retain the source components in the housing.

In an additional aspect, a mass spectrometer comprising a housing configured to receive a source and comprising a first integral alignment feature is described. In certain embodiments, the mass spectrometer can include a terminal lens coupled to the housing and constructed and arranged to provide a beam, the terminal lens comprising a second integral alignment feature and constructed and arranged to couple to the housing when the first integral alignment feature is coupled to the second integral alignment feature to align the terminal lens with the source components in the housing and retain source components in the housing to provide a source assembly. In some embodiments, the mass spectrometer can also include a mass analyzer coupled to the terminal lens.

In another aspect, a mass spectrometer comprising a housing configured to receive source components and comprising a first set of integral alignment features is disclosed. In certain examples, the mass spectrometer can include a terminal lens coupled to the housing and constructed and arranged to provide a beam, the terminal lens comprising a second set of integral alignment features and constructed and arranged to couple to the housing when the first set of integral alignment features are coupled to the second set of integral alignment features to align the terminal lens with the source components in the housing and retain the source components in the housing to provide a source assembly. In some examples, the mass spectrometer can include a mass analyzer coupled to the terminal lens.

In an additional aspect, an instrument comprising a fluid chromatograph and a mass spectrometer coupled to the fluid chromatograph to receive analyte from the fluid chromatograph is described. In certain examples, the mass spectrometer comprises source components in a housing and a terminal lens configured to provide a beam and coupled to the housing, the housing comprising a first integral alignment feature, the terminal lens comprising a second integral alignment feature and constructed and arranged to couple to the housing when the first integral alignment feature is coupled to the second integral alignment feature to align the terminal lens with the source components in the housing and retain components in the housing to provide a source assembly.

In another aspect, an instrument comprising a fluid chromatograph, and a mass spectrometer fluidically coupled to the fluid chromatograph to receive analyte from the fluid chromatograph, the mass spectrometer comprising source components in a housing and a terminal lens configured to provide a beam and coupled to the housing, the housing comprising a first set of integral alignment features, the terminal lens and comprising a second set of integral alignment features constructed and arranged to couple to the housing when the first set of integral alignment features are coupled to the second set of integral alignment features to align the terminal lens with the source components in the housing and retain the source components in the housing to provide a source assembly is provided.

In an additional aspect, a terminal lens configured to provide ions or electrons and comprising an integral alignment feature constructed and arranged to couple to a corresponding alignment feature of a housing of a source assembly is provided. In some examples, the integral alignment feature is effective to align the terminal lens with source components in the housing of the source assembly when the integral alignment feature and the corresponding alignment feature of the housing of the source assembly are coupled, the terminal lens further configured to retain the source components in the housing of the source assembly upon coupling of the alignment features.

In another aspect, a terminal lens configured to provide ions or electrons and comprising a set of integral alignment features constructed and arranged to couple to corresponding alignment features of a housing of a source assembly, the integral alignment features effective to align the terminal lens with source components in the housing of the source assembly when the integral alignment features and the corresponding alignment features of the housing of the source assembly are coupled, the terminal lens further configured to retain the source components within the housing of the source assembly upon coupling of the sets of alignment features is disclosed.

In an additional aspect, a method comprising coupling a first integral alignment feature on a source housing to a second integral alignment feature on a terminal lens operative to provide a beam, the coupling of the alignment features resulting in retention of source components in the source housing and alignment of the source components in the source housing with the terminal lens is provided.

In another aspect, a method comprising coupling a first set of integral alignment features on a source housing to a second set of integral alignment features on a terminal lens effective to provide a beam, the coupling of the alignment features resulting in retention of source components in the source housing is described.

In an additional aspect, a kit comprising a housing constructed and arranged to receive source components, the housing comprising a first integral alignment feature is disclosed. In certain examples, the kit can also include a terminal lens constructed and arranged to provide a beam, the terminal lens comprising a second integral alignment feature configured to couple to the first alignment feature of the housing to retain the source components in the housing and to align the terminal lens with the source components.

In another aspect, a kit comprising a housing constructed and arranged to receive source components, the housing comprising a first set of integral alignment features is provided. In certain examples, the kit can also include a terminal lens constructed and arranged to provide a beam, the terminal lens comprising a second set of integral alignment features configured to couple to the first set of integral alignment features to retain the source components in the housing and align the terminal lens with the source components.

In an additional aspect, a method of facilitating assembly of an ion source, the method comprising providing a terminal lens configured to provide a beam, the terminal lens comprising an integral alignment feature that is configured to couple to an integral alignment feature on a housing of the ion source to align the terminal lens with ion source components in the housing and to retain the ion source components in the housing to provide the ion source is described.

In another aspect, a method of facilitating assembly of an electron source, the method comprising providing a terminal lens configured to provide a beam, the terminal lens comprising an integral alignment feature that is configured to couple to an integral alignment feature on a housing of the electron source to align the terminal lens with electron source components in the housing and to retain the electron source components in the housing to provide the electron source is provided.

In an additional aspect, a method of facilitating assembly of an ion source, the method comprising providing a terminal lens configured to provide a beam, the terminal lens comprising a set of integral alignment features that are configured to couple to a set of integral alignment features on a housing of the ion source to align the terminal lens with ion source components in the housing and to retain the ion source components in the housing to provide the ion source is disclosed.

In another aspect, a method of facilitating assembly of an electron source, the method comprising providing a terminal lens configured to provide a beam, the terminal lens comprising a set of integral alignment features that are configured to couple to a set of integral alignment features on a housing of the electron source to align the terminal lens with electron source components in the housing and to retain the electron source components in the housing to provide the electron source is described.

In an additional aspect, a tool-less assembly method for assembling source components in a source assembly, the method comprising adding the source components to a housing, and coupling a first integral alignment feature on the housing to a second integral alignment feature on a terminal lens of the source assembly to provide an assembled source assembly without using any tools is provided.

In another aspect, a tool-less assembly method for assembling source components in a source assembly, the method comprising adding the source components to a housing, and coupling a first set of integral alignment features on the housing to a second set of integral alignment feature on a terminal lens of the source assembly to provide an assembled source assembly without using any tools is described.

Additional features, aspect, examples and embodiments are described in more detail below.

BRIEF DESCRIPTION OF THE FIGURES

Certain embodiments are described with reference to the figures in which.

Figure 1:
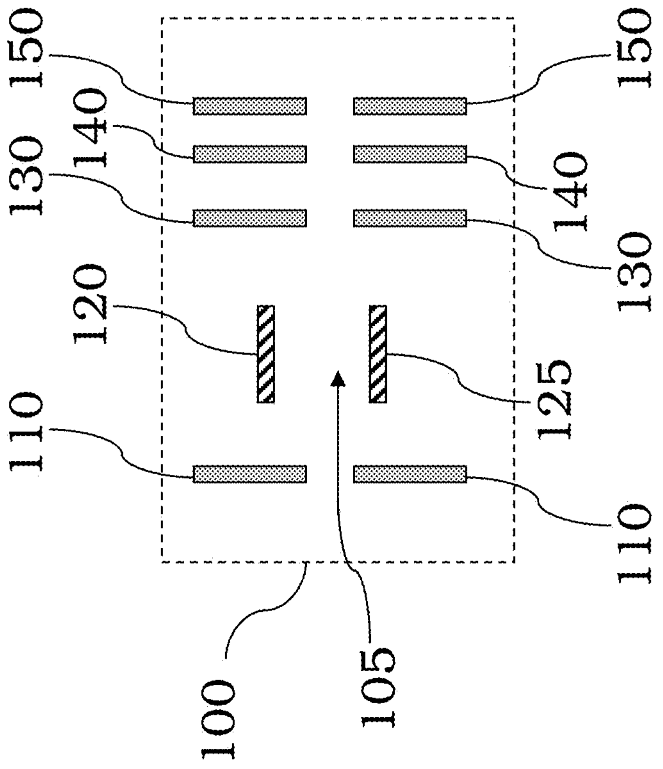
FIG. 1 is an illustration of a source, in accordance with certain examples.

It will be recognized by the person of ordinary skill in the art, given the benefit of this disclosure, that certain dimensions or features in the figures may have been enlarged, distorted or shown in an otherwise unconventional or non-proportional manner to provide a more user friendly version of the figures. Where dimensions or values are specified in the description below, the dimensions or values are provided for illustrative purposes only.

DETAILED DESCRIPTION

Certain embodiments are described below with reference to singular and plural terms in order to provide a user friendly description of the technology disclosed herein. These terms are used for convenience purposes only and are not intended to limit the source assemblies as including or excluding certain features unless otherwise noted as being present in a particular embodiment described herein.

Illustrative forms of the technology described herein may include a terminal lens that can provide a beam such as a beam from an ion source, an electron source, a particle source or other sources that provide charged particles in a fluid stream. The term "provide" is used in a broad sense and includes focusing, direction or selection of a stream of fluid or selection or direction of a particular particle or atomized species from the fluid, which typically includes charged particles, charged atoms and/or charged molecules or fragments thereof. The beam generally does not originate at the terminal lens but is instead outputted at the terminal lens and passed to another device or component. For example, while the exact operation of the lens can vary, the lens is typically operative to expose the beam to an electric field, a magnetic field or both to select or direct desired species through the lens and onto another component of the system, e.g., a mass analyzer. The beam which is outputted may be focused, rendered parallel or otherwise outputted in a desired manner using the source assemblies described herein. In a typical configuration, the various lenses of the system are typically held at a certain voltage during the time which an ion or electron in the beam traverses the lenses' field to focus the beam. The terminal lens can operate in conjunction with one or more additional lenses and other components of a source assembly to provide a desired output from the source assembly. The term "terminal" is used to refer to the last lens that the beam is exposed to, and other lenses in the system may include features, e.g., alignment features, similar to the features of the terminal lens. Exemplary components and configurations are described by way of illustration in the embodiments below.

Various components are described below as being "coupled to" another component. Such coupling may be direct physical contact between the components or may take the form of a path that permits fluid or a species to travel from one component to another, e.g., a path permitting ions to pass from a terminal lens to a mass analyzer. Coupling can be achieved in many different manners and, where desired, using internal or external fasteners. The source assemblies described herein can also be coupled to an instrument housing using couplers such as those described, for example in commonly assigned U.S. application Ser. No. 12/900,572 filed on Oct. 9, 2010, the entire disclosure of which is incorporated herein by reference for all purposes.

In certain embodiments, alignment features are included on or in the components to facilitate assembly and disassembly of the components and to align the source with the terminal lens or focusing device. The alignment features facilitate assembly of the components to thereby align the source and the lens and desirably other components in the housing of the source assembly. In addition, the alignment features also facilitate disassembly of the components, e.g., for cleaning or servicing, and subsequent reassembly to align the lens and the source. For example, where the source assembly is present in a mass spectrometer, the source assembly can be removed without the need for using an insertion/removal tool, can be disassembled by decoupling the terminal lens to the housing of the source assembly, and the desired components of the source assembly can be removed and cleaned.

In some examples, the alignment features are "integral" in that they are part of the components and generally are not removable without damage to the component or the alignment feature. For example, the alignment features may be machined into the terminal lens and/or housing during manufacture of those components. In other embodiments, the alignment features can be added post-manufacturing by welding, soldering or the like. In some embodiments, the terminal lens and/or housing can be manufactured using a mold or molding processes such that the alignment features are formed during the molding process. In certain examples, one or more of the alignment features may be external such that the alignment feature is on an outer surface of the component, whereas in other examples, one or more alignment features may be internal such that the alignment feature is present on an inner surface of the component. Notwithstanding that the alignment features can be positioned in many different configurations, the alignment features desirably couple to each other to facilitate assembly of the source assembly and to permit suitable operation of the device including the assembled source assembly. While integral alignment features can be used to align the lens and the housing, screws, fasteners or other non-integral components can also be used to assemble the source assemblies, if desired. In addition, once the source assembly is ready for insertion into a device or instrument, securing means such as fasteners, screws, springs, retainers or the like can be used to secure the source assembly to the chassis or housing of the overall device.

In certain embodiments, the source for use with the terminal lenses described herein is not critical and can include ion sources such as those present in a mass spectrometer, in an ion implanter or in other systems and devices commonly using an ion source, electron sources or other sources that are commonly used in chemical analysis and sources commonly used to provide ion or electron beams, e.g., those used in fabrication processes and the like. A typical ion source (see FIG. 1) can include numerous components including, for example, a repellor 110, a filament 120, and a plurality of lenses 130, 140, and 150 in a housing 100. Electrons can be omitted from the filament 120 when the filament 120 is heated. The electrons can be accelerated toward an anode 125 using a potential difference between the anode 125 and the filament 120. A gas stream 105 comprising a sample can be provided substantially perpendicular to the direction which the electrons are accelerated. The accelerated electrons collide with the sample and cause ionization of the sample, e.g., production of singly charged positive ions. The positively charged ions are attracted by the lens 130 by creating a potential difference between the lens 130 and the repellor 110. The lens 130, along with the lenses 140 and 150 can focus or manipulate the ion beam such that it is passed to a desired device. The ion source shown in FIG. 1 is merely illustrative, and different ion sources can include different components or other components than the ones shown in FIG. 1.

In certain examples, the source assembly can include a housing and a terminal lens. In some embodiments, the housing is designed to contain the components of the source assembly, e.g., the repellor, filament, ion volume, lenses, insulators, etc. Together these components function as an ion source or an electron source, depending on the exact components selected for inclusion in the housing. The terminal lens can be coupled to the housing to retain the components in the housing while at the same time functioning as a lens to focus a beam received from the other components of the source assembly.

Figure 2B:
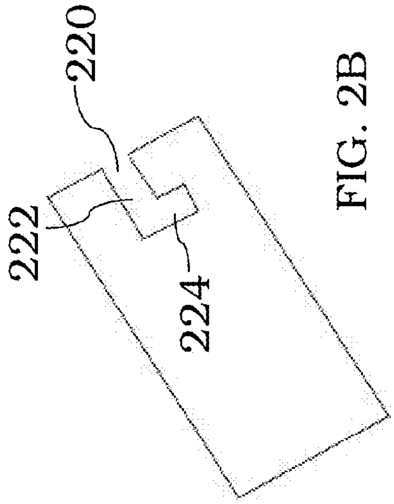
FIGS. 2A-2D are illustrations of different alignment features, in accordance with certain examples.
Figure 2D:
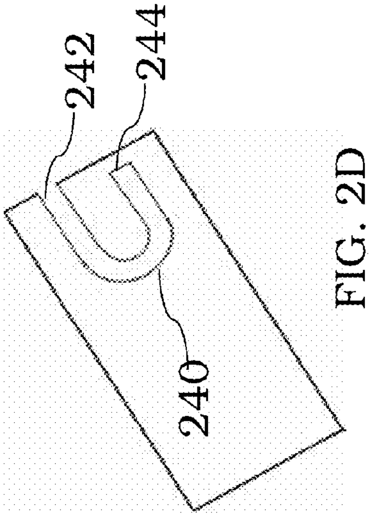
Figure 2A:
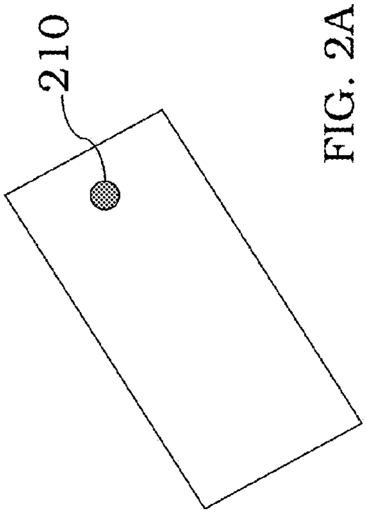
Figure 2C:
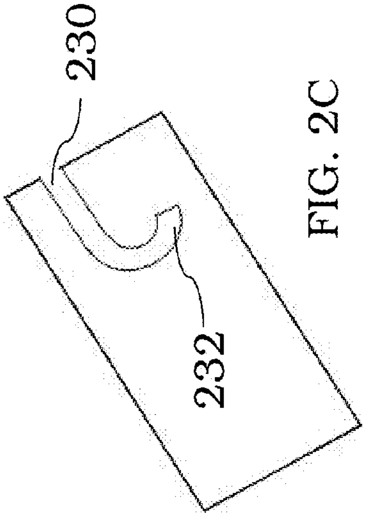

In certain embodiments, to facilitate coupling of the housing and the terminal lens, the housing can include a first integral alignment feature, and the terminal lens can include a second integral alignment feature. Without being bound by any particular configuration, coupling of the respective alignment features on the source housing and the terminal lens operates to retain the source components in the housing and align the various source components with the terminal lens such that the overall source assembly functions properly. The configuration of the alignment features is desirably selected such that proper engagement of the alignment features acts to retain the terminal lens to the housing and thereby retain the source components in the housing at desired positions and orientations. In some examples and referring to FIG. 2A, one of the first and second integral alignment features comprises a pin 210 and the other integral alignment feature comprises a slot 220. When the pin 210 is inserted into the slot 220, insertion acts to retain the pin 210 in the slot 220 and retain the components in the source assembly. The exact configuration of the slot can vary and illustrative slots are shown in FIGS. 2B-2D and include an L-shaped slot 220 (FIG. 2B) that includes a first channel 222 parallel to the longitudinal axis and a second channel 224 perpendicular to the first arm 222. The second channel 224 may include a detent such that the pin 210 can be held in place within the second channel 224. Referring to FIG. 2C, the slot can be configured as a J-shaped slot 230 which include a portion 232 that can be configured to retain the pin 210 and couple the terminal lens to the housing. Referring to FIG. 2D, the slot can be configured as a generally U-shaped slot 240. The pin 210 can be inserted into the opening 242 in the U-shaped slot 240 and pushed downward and around the channel until it rests on an opposite side 244 of the U-shaped slot 240. In some examples, one of the alignment features can be a pin and the other alignment feature can be a hole such that insertion of the pin into the hole acts to retain the source components in the housing. The pin may be spring loaded such that depression of the pin, followed by insertion of the terminal lens into the housing will result in retention of the terminal lens to the housing when the pin engages the hole and returns to its non-depressed state. In yet other configurations, one of the alignment features can be a pin and the other alignment feature can be a hook. The hook can act to loop around the pin to retain the terminal lens to the housing.

In certain examples, the alignment features can be configured internal to the body of the terminal lens or the housing such that they do not interfere with insertion of the source assembly into a desired device or instrument. In some embodiments, one of the alignment features is internal, e.g., generally cannot be viewed or seen from the outer surface, whereas the other alignment feature may be external or internal. In other embodiments, both of the alignment features may be external such that they can be viewed from the outer surfaces of the housing or the terminal lens even after coupling of the alignment features.

In certain embodiments where corresponding alignment features are present, each of the alignment features can be configured such that they can be coupled in only a single manner. For example, the alignment features may be selected and/or positioned such that they only couple in a single orientation to avoid incorrect assembly of the subassembly. In some embodiments, the alignment feature on the terminal lens can be positioned suitably to provide a friction fit when coupled to the alignment feature on the housing. In other embodiments, additional fasteners, couplers or the like can be used with the alignment features to assist in retaining the terminal lens to the housing.

In some embodiments, the source assemblies described herein can be removed from a mass spectrometer without using an insertion/removal tool. In many existing configurations, an insertion/removal tool is used to remove the source assembly from a device. For example, U.S. Pat. No. 7,709,790 describes removal of a subassembly from a mass spectrometer enclosure using an insertion/removal tool. Embodiments of the source assemblies described herein do not require the use of an insertion/removal tool to place the source assembly in a device or remove the source assembly from a device.

In certain embodiments, the source assemblies described herein can include additional source components, which together, can function as an ion source, electron source, or other type of source. For example, the source assembly can include a filament in the housing. The exact nature and type of filament can vary and illustrative types of filaments include, but are not limited to tungsten, rhenium, surface-coated metals, flat wire, coiled wire, hair-pin configurations and other filaments commonly used in sources. The source assembly can also include two or more lenses that can function independently of each other or can function in a cooperative manner with one or more other lenses of the systems. In some examples, the source assembly can include two or more lenses between the filament and the terminal lens such that a beam is provided as an output from the source assembly.

In certain embodiments, the source assembly can also include additional components such as insulators to prevent arcing or shorting out of the various different components. For example, many components of the source assembly may be charged or otherwise have some voltage. To separate electrically the different components, one or more insulators may be placed between the components to provide for proper operation of the various components. The exact materials used in the insulators are not critical and desirably the insulators are thick enough and have a desired shape to electrically isolate the various components from each other.

In certain embodiments, the source assembly including a terminal lens with an alignment feature can include a source block coupled to a repellor insulator. In some examples, the source assembly can also include a repellor coupled to the repellor insulator. In other examples, the source assembly can also include an ion volume insulator coupled to the repellor. In certain examples, the source assembly can include a trap insulator coupled to the repellor. In additional examples, the source assembly can include a trap coupled to the trap insulator. In further examples, the source assembly can include an ion volume comprising the filament and a first lens, in which the ion volume is coupled to the trap. In other examples, the source assembly can include a second lens coupled to the ion volume and optionally a third lens coupled to the ion volume. In certain embodiments, the terminal lens can be coupled to the second lens or the third lens (when present).

In certain examples, the components of the source assembly can be produced from materials that are substantially inert such that no unwanted chemical reactions occur on the surfaces of the components. The components can include inert coatings, can be produced from substantially inert materials such as titanium, Inconel® alloys, metal alloys, carbon coatings such as, for example, diamond coatings or other materials that do not substantially react with any molecules, atoms or particles in the sample or generated by interaction of the sample with the ions or electrons from the filament. In some examples, all components that are exposed to sample and/or ions may be produced from the substantially inert materials, whereas in other embodiments, only one or more components may be produced from the substantially inert material. For example, any one or more of the housing, terminal lens, other lenses, repellor, anode, filament, etc. can be produced with or using substantially inert metal materials.

In certain embodiments, the source assembly can include one or more biasing means to keep the various components positioned in a suitable manner. In some examples, the biasing means may be placed adjacent to the terminal lens to force or push the terminal lens away from the housing and assist in retaining coupling of the first and second alignment features. The biasing means may take different forms including springs, elastomeric spacers, coils and the like.

In certain examples, the terminal lens can be configured as a unitary lens effective to function both as a lens and to retain source components in the housing. The term unitary refers to the terminal lens being a single component that is configured to retain the source components in the housing, when coupled to the alignment feature of the housing, without using additional fasteners or other devices to retain the source components in the housing.

In other embodiments, the source assembly produced from coupling the first and second alignment features may include means for securing the source assembly in a device. Such securing means may take the form of tabs, holes or other features that can mate or couple to a device to secure the source assembly to the device. In certain examples, the securing means can be placed and retained in the device through a friction fit between the source assembly and the device, whereas in other examples, external fasteners such as screws, bolts, nuts and the like may secure the source assembly to the device.

In certain embodiments, a source assembly can include a housing configured to receive source components and comprising a first set of integral alignment features. As described further below, the first set of integral alignment features can be coupled to a second set of integral alignment features on a terminal lens constructed and arranged to focus a beam. Coupling of the sets of alignment features can act to align the terminal lens with source components in the housing and retain the source components in the housing.

In certain examples, each alignment feature of the set can be the same or can be different. For example, the housing or the terminal lens may each include two alignment features which are different. By including different alignment features on each of the housing and the terminal lens, the terminal lens and housing can be coupled in a single orientation. In some embodiments, each set of alignment features can include three or more alignment features with any two of the alignment features being the same. Where sets of alignment features are present, the alignment features may take many different configurations including, but not limited to, the pins, hooks, slots, bayonets and other illustrative configurations described herein.

In certain embodiments, all alignment features of the set may be substantially the same. For example, one set of the first and second integral alignment features can be configured as pins and the other set of integral alignment features can be configured as slots. In another example, one set of the first and second integral alignment features can be configured as pins and the other set of integral alignment features can be configured as holes. In an additional example, one set of the first and second integral alignment features can be configured as hooks and the other set of integral alignment features can be configured as pins. In another example, one set of the first and second integral alignment features can be configured as pins and the other set of integral alignment features can be configured as L-shaped slots. Other alignment feature configurations are possible and will be recognized by the person of ordinary skill in the art, given the benefit of this disclosure. In some examples, the set of first integral alignment features can be configured to couple to the second set of integral alignment features in only a single orientation to align the terminal lens with the source components and retain the source components in the housing.

Figure 3:
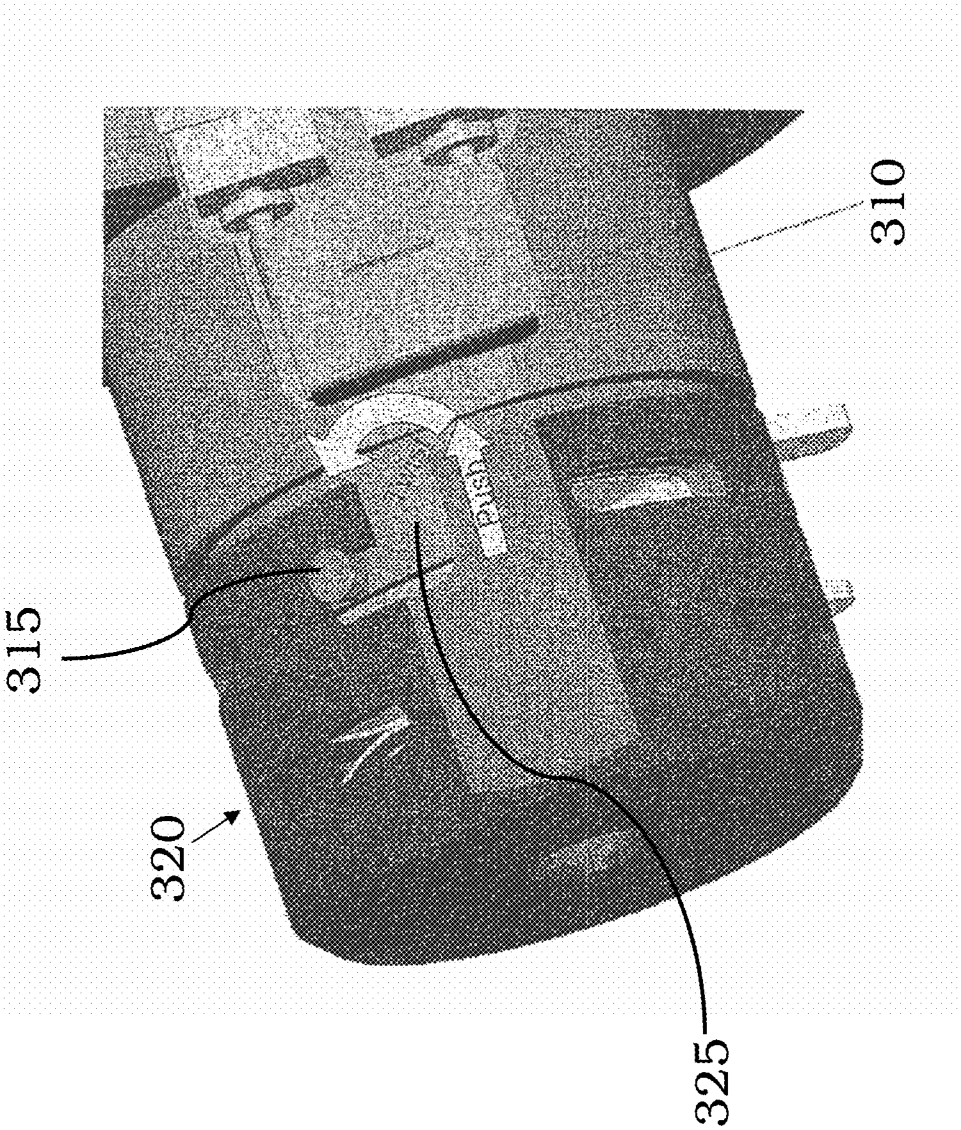
FIG. 3 is an illustration of first and second alignment features, in accordance with certain examples.

In an additional example, the first set of integral alignment features can include first, second and third bayonets positioned with substantially equal circumferential spacing on the housing, and the second set of integral alignment features comprise first, second and third L-shaped slots each configured to receive a corresponding one of the first, second and third bayonets of the housing. An illustration of one of the bayonet/slot pairs is shown in FIG. 3. The housing 310 comprises a bayonet 315 that couples to an L-shaped slot 325 on the terminal lens 320. To couple the terminal lens 320 to the housing 310, the bayonet 315 is inserted in an axial direction into the slot 325 by pushing the terminal lens 320 toward the front surface of the housing 310. Upon engagement of the bayonet 315 with the lower portion of the first channel of the L-shaped slot 325, either the terminal lens 310, the housing 320 or both are rotated or twisted such that the bayonet 315 moves toward the second channel of the L-shaped slot 325. Biasing means (not shown) such as a spring, elastomer or the like can be present to force the terminal lens 320 away from the housing 310 to maintain a force between the bayonet 315 and the L-shaped slot 325. If desired, the L-shaped slot 325 can include a detent which can assist in retention of the bayonet 315 in the L-shaped slot 325. To remove the terminal lens 320 from the housing 310, the terminal lens 320 can be rotated in an opposite direction toward where the first channel and the second channel meet. The terminal lens 320 can then be separated from the housing 310 by movement of the terminal lens 320 away from the housing 310 in an axial direction.

In certain embodiments, the terminal lens that includes a set of alignment features can be effective to focus ions. In other embodiments, the terminal lens that includes a set of alignment features can be effective to focus electrons. In embodiments where sets of alignment features are present, the source assembly can be configured to be removed from a mass spectrometer without using an insertion/removal tool, as described herein in reference to other embodiments. Similarly, a terminal lens having a set of alignment features can be used with other source components including but not limited to, filaments, repellors, lenses, insulators and the like. For example, a source assembly including a terminal lens with a set of alignment features can include a source block coupled to a repellor insulator. In some examples, the source assembly can also include a repellor coupled to the repellor insulator. In other examples, the source assembly can also include an ion volume insulator coupled to the repellor. In certain examples, the source assembly can include a trap insulator coupled to the repellor. In additional examples, the source assembly can include a trap coupled to the trap insulator. In further examples, the source assembly can include an ion volume comprising the filament and a first lens, in which the ion volume is coupled to the trap. In other examples, the source assembly can include a second lens coupled to the ion volume and optionally a third lens coupled to the ion volume. In certain embodiments, the terminal lens can be coupled to the second lens or the third lens (when present).

In certain examples, other components may also be present between the housing and the terminal lens, e.g., biasing means and the like, to facilitate retention of the source components in the housing and coupling of the housing and the terminal lens. Similarly, a terminal lens that includes a set of alignment features can be configured as a unitary lens effective to function as a lens and to align the source components with the terminal lens. In additional examples, the source assembly can include means for securing the source assembly in a device, e.g., securing means that is configured to enable removal of the source assembly without using an insertion/removal tool. Other components may also be present in the source assembly or on the housing of the source assembly.

Figure 4:
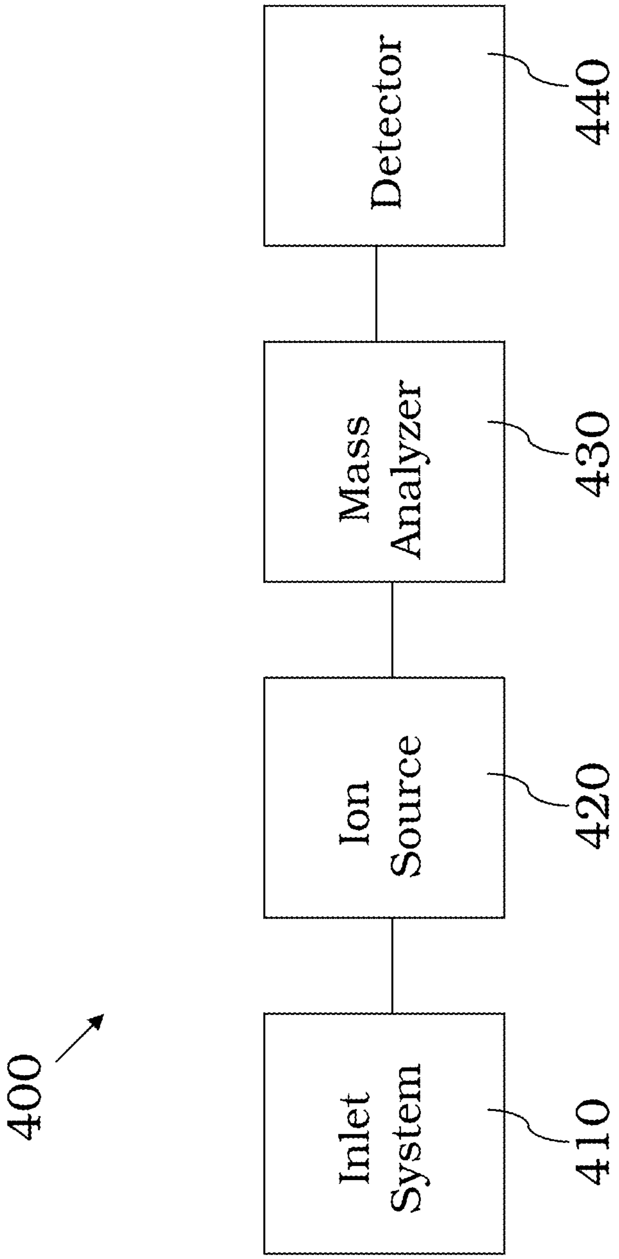
FIG. 4 is a schematic of a mass spectrometer, in accordance with certain examples.

In certain examples, a terminal lens with an alignment feature can be used in a mass spectrometer as part of an ion source. Where the ion source is present in a mass spectrometer, it can be used to ionize the analyte. The ion source used in a mass spectrometer can have different components, and for ease of illustration and without limitation, certain components of a mass spectrometer are described below. Referring to FIG. 4, a mass spectrometer 400 generally includes an inlet system 410 fluidically coupled to an ion source 420, which is coupled to a mass analyzer 430. The mass analyzer 430 is coupled to a detector 440. The operating pressure of the mass spectrometer is below atmospheric pressure (typically $10^{-5}$ to $10^{-8}$ Torr) by using a vacuum system.

In certain examples, the inlet system 410 of the mass spectrometer 400 can be any of the commonly used inlet systems including, but not limited to, batch inlet systems, direct probe inlets, chromatographic inlet systems or other common inlet systems available from PerkinElmer Health Sciences, Inc.

(Waltham, Mass.). Regardless of the particular inlet system selected, the inlet system functions to permit introduction of a sample into the ion source 420 with minimal loss of vacuum.

In some examples, the mass analyzer 430 of the mass spectrometer 400 can be any commonly used mass analyzer including, but not limited to, magnetic sector analyzers, time of flight analyzers, quadrupole mass filters, ion trap analyzers including, for example, linear quadrupole ion traps, three-dimension quadrupole ion traps, orbitraps, toroidal ion traps, cyclotron resonance or other mass analyzers available from PerkinElmer Health Sciences, Inc. Regardless of the type of mass analyzer selected, the mass analyzer 430 receives ionized sample from the ion source 420 and is effective to separate ions with different mass-to-charge ratios.

In certain embodiments, the detector 440 of the mass spectrometer 430 can be any one or more of detectors commonly used in mass spectrometry including, but not limited to, an electron multiplier, a Faraday cup, photographic plates, scintillation detectors, microchannel plate detectors and other detectors. The detector 440 is fluidically coupled to the mass analyzer 430 such that it can receive separated ions from the mass analyzer for detection.

In certain examples, the ion source may be selected from gas phase sources and desorption sources and combinations thereof. For example, the source can be an electron ionization source, a chemical ionization source, a field ionization source, a field desorption source, a fast atom bombardment source, secondary ion mass spectrometry, a laser desorption source, a plasma desorption source, a thermal desorption, an electrospray ionization source, a thermospray ionization source or other sources that can be used either alone or in combination to provide a beam of an ionizing agent to a sample. In some instances, more than a single source can be present in the mass spectrometer, and a user may select a desired source. Suitable commercial source assemblies are commonly from PerkinElmer Health Sciences, Inc., and such source assemblies can be used with the technology described herein to facilitate alignment of a terminal lens with source components and to retain source components in the housing of a source assembly.

In certain embodiments, the source assembly of a mass spectrometer can include a housing configured to receive a source and comprising a first integral alignment feature. In some embodiments, the first alignment feature can be coupled to a second alignment features on a terminal constructed and arranged to focus a beam. In some examples, the terminal lens can be constructed and arranged to couple to the housing when the first integral alignment feature is coupled to the second integral alignment feature to align the terminal lens with the source components in the housing and retain source components in the housing to provide a source assembly. The terminal lens is coupled to a mass analyzer to provide ionized sample to the mass analyzer.

In examples where the mass spectrometer includes a terminal lens with a second alignment feature and a housing with a first alignment feature, one of the first and second integral alignment features can be configured as a pin and the other integral alignment feature can be configured as a slot. In other examples, one of the first and second integral alignment features can be configured as a pin and the other integral alignment feature can be configured as a hole. In some examples, one of the first and second integral alignment features can be configured as a hook and the other integral alignment feature can be configured as a pin. In additional examples, one of the first and second integral alignment features can be configured as a pin and the other integral alignment feature can be configured as a L-shaped slot. In some embodiments, at least one of the first and second integral alignment features is internal, whereas in other embodiments, at least one of the first and second integral alignment features are external.

In some examples, the mass spectrometer can include a source housing where the first integral alignment feature is configured to couple to the second integral alignment feature in only a single orientation to align the terminal lens with the source components and retain the source components in the housing. Such a configuration reduces the likelihood that a user will incorrectly reassemble the source after removal and/or cleaning. In certain examples, the first integral alignment features comprises first, second and third bayonets positioned with substantially equal circumferential spacing on the housing, and the second integral alignment feature comprises first, second and third L-shaped slots each configured to receive a corresponding one of the first, second and third bayonets of the housing. In other examples, the source assembly of the mass spectrometer can be configured such that it is removable from the mass spectrometer without using an insertion/removal tool.

In certain examples, the source assembly of the mass spectrometer including the terminal lens with an alignment feature further comprises a filament in the housing. In other examples, the source assembly comprises an additional lens or lenses between the filament and the terminal lens. Other components may also be present in the source assembly of the mass spectrometer. For example, a source assembly including a terminal lens with an alignment feature can include a source block coupled to a repellor insulator. In some examples, the source assembly can also include a repellor coupled to the repellor insulator. In other examples, the source assembly can also include an ion volume insulator coupled to the repellor. In certain examples, the source assembly can include a trap insulator coupled to the repellor. In additional examples, the source assembly can include a trap coupled to the trap insulator. In further examples, the source assembly can include an ion volume comprising the filament and a first lens, in which the ion volume is coupled to the trap. In other examples, the source assembly can include a second lens coupled to the ion volume and optionally a third lens coupled to the ion volume. In certain embodiments, the terminal lens can be coupled to the second lens or the third lens (when present). Additional components may also be present in the source assembly and in the mass spectrometer. For example, the source assembly can include biasing means between the third lens and the terminal lens. In some examples, the terminal lens of the source assembly of the mass spectrometer can be configured as a unitary lens effective to function as a lens and to retain source components in the housing. The source assembly can also include means for securing the source assembly in a device, e.g., securing means configured to enable removal of the source assembly without using an insertion/removal tool.

In certain embodiments, the mass spectrometer can include a source assembly that has a terminal lens with a set of integral alignment features. For examples, the mass spectrometer can include a housing configured to receive source components and comprising a first set of integral alignment features, and a terminal lens coupled to the housing and constructed and arranged to focus a beam. In some examples, the terminal lens includes a second set of integral alignment features such that the terminal lens is constructed and arranged to couple to the housing when the first set of integral alignment features are coupled to the second set of integral alignment features. In some embodiments, coupling of the alignment features aligns the terminal lens with the source components in the housing and retains the source components in the housing to provide a source assembly.

In certain embodiments where a mass spectrometer source assembly includes a terminal lens and a housing each including a set of integral alignment features, one set of the integral alignment features can be configured as pins and the other set of integral alignment features can be configured as slots. In other examples, one set of the integral alignment features can be configured as pins and the other set of integral alignment features can be configured as holes. In additional examples, one set of the integral alignment features can be configured as hooks and the other set of integral alignment features can be configured as pins. In other embodiments, one set of the integral alignment features can be configured as pins and the other set of integral alignment features can be configured as L-shaped slots. Where sets of alignment features are present, a particular set of first integral alignment features can include different alignment features or can include the same alignment features. In some embodiments, the alignment features can be selected such that the set of first integral alignment features can be coupled to the second set of integral alignment features in only a single orientation to align the terminal lens with the source components and retain the source components in the housing. In certain embodiments, the first set of integral alignment features can be first, second and third bayonets positioned with substantially equal circumferential spacing on the housing, and the second set of integral alignment features can be first, second and third L-shaped slots each configured to receive a corresponding one of the first, second and third bayonets of the housing. In some examples, the source assembly can be configured to be removed from the mass spectrometer without using an insertion/removal tool.

In certain examples, a mass spectrometer source assembly including a terminal lens with a set of alignment features can also include other source components to render the assembly operative as an ion source or an electron source, for example. In some embodiments, a filament can be present in the housing. In other embodiments, an additional lens can be present between the filament and the terminal lens. In further embodiments, the source assembly can include a source block coupled to a repellor insulator. In some examples, the source assembly can also include a repellor coupled to the repellor insulator. In other examples, the source assembly can also include an ion volume insulator coupled to the repellor. In certain examples, the source assembly can include a trap insulator coupled to the repellor. In additional examples, the source assembly can include a trap coupled to the trap insulator. In further examples, the source assembly can include an ion volume comprising the filament and a first lens, in which the ion volume is coupled to the trap. In other examples, the source assembly can include a second lens coupled to the ion volume and optionally a third lens coupled to the ion volume. In certain embodiments, the terminal lens can be coupled to the second lens or the third lens (when present). In certain examples, the source assembly can also include biasing means between the third lens and the terminal lens. In some examples, the terminal lens can be configured as a unitary lens effective to function as a lens and retain the source components in the housing. In other examples, the source assembly can include means for securing the source assembly in a device, e.g., means configured to enable removal of the source assembly without using an insertion/removal tool.

In certain embodiments, a device comprising one or more of the source assemblies disclosed herein, e.g., a source assembly with an alignment feature or a set of alignment features, optionally with other features is provided. For example, the source assemblies described herein can be used in particle accelerators, ion implanters, ion engine and other devices that use ions, electrons or particles for processing or analysis. Where the device includes a terminal lens as part of the source assembly, the terminal lens can include an alignment feature or a set of alignment features. The housing of the source assembly can include a corresponding alignment feature or set of alignment features such that the terminal lens and the housing can be coupled and act to retain the source components within the source assembly. The source assembly can include other components, e.g., filaments, repellors, lenses and the like, that are described in reference to other embodiments provided herein.

In certain embodiments, the mass spectrometers described herein can be used in tandem with another mass spectrometer or other instrument. Where tandem MS/MS is used, at least one of the MS devices can be configured as described herein, e.g., including a terminal lens with an alignment feature or a set of alignment features. One application of tandem mass spectrometers is the identification of molecular ions and their fragments by mass spectrometric analysis (MS and MS/MS, respectively). A tandem mass spectrometer performs molecular ion identification by mass-selecting a precursor ion of interest in a first stage, fragmenting the ion in a second stage, and mass-analyzing the fragment in a third stage. Tandem MS/MS instruments can be, for example, sequential in space (for example, consisting of a two quadrupole mass filters separated by a collision cell) or sequential in time (for example, a single three-dimensional ion trap).

Figure 5:
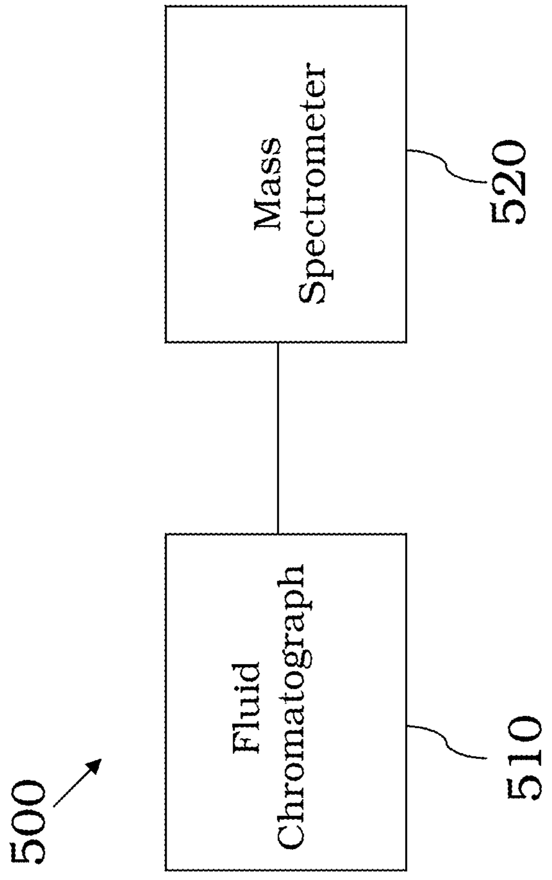
FIG. 5 is a schematic of an instrument, in accordance with certain examples.

In certain examples, an instrument comprising a fluid chromatograph, and a mass spectrometer is provided. The term "fluid chromatograph" is intended to encompass many different types of chromatographic devices that use a fluid, e.g., a gas, liquid, supercritical fluid, etc., including, but not limited to, gas chromatographs, liquid chromatographs, high performance liquid chromatographs, capillary electrophoresis and other chromatographs that can separate species in a fluid using differential partitioning of analytes between a mobile phase and a stationary phase or using difference in migration rates. An illustrative instrument is shown in FIG. 5. The instrument 500 includes a fluid chromatograph 510 hyphenated to a mass spectrometer 520. The fluid chromatograph 510 may be hyphenated through a suitable inlet to provide fluid flow from the fluid chromatograph 510 to the mass spectrometer 520, which typically is operating at a lower pressure than the pressure used by the fluid chromatograph 510.

In certain embodiments, the mass spectrometer of the instrument can be configured with a source assembly that includes source components in a housing and a terminal lens configured to focus a beam and coupled to the housing, with the housing comprising a first integral alignment feature, the terminal lens comprising a second integral alignment feature and constructed and arranged to couple to the housing when the first integral alignment feature is coupled to the second integral alignment feature to align the terminal lens with the source components in the housing and retain components in the housing to provide a source assembly. In some examples, one of the first and second integral alignment features can be configured as a pin and the other integral alignment feature can be configured as a slot. In other examples, one of the first and second integral alignment features can be configured as a pin and the other integral alignment feature can be configured a hole. In additional examples, one of the first and second integral alignment features can be configured as a hook and the other integral alignment feature can be configured as a pin. In further examples, one of the first and second integral alignment features can be configured as a pin and the other integral alignment feature can be configured as a L-shaped slot. In some examples, at least one of the first and second integral alignment features are internal, whereas in other examples at least one of the first and second integral alignment features are external. In certain examples, the source can be configured as an ion source or an electron source. In other examples, the mass spectrometer can include a mass analyzer coupled to the terminal lens. In some examples, the first integral alignment feature is configured to couple to the second integral alignment feature in only a single orientation to align the terminal lens with the source components and retain the source components in the housing.

In certain embodiments, the instrument can include a housing where the first integral alignment features comprises first, second and third bayonets positioned with substantially equal circumferential spacing on the housing, and a terminal lens where the second integral alignment feature comprises first, second and third L-shaped slots each configured to receive a corresponding one of the first, second and third bayonets of the housing. In some embodiments, the source assembly is configured to be removed from the mass spectrometer without using an insertion/removal tool. In certain examples, the source assembly of the instrument further comprises a filament in the housing. In some examples, the source assembly of the instrument comprises an additional lens between the filament and the terminal lens. In additional examples, the source assembly of the instrument can include three lenses between the filament and the terminal lens. In some examples, the source assembly of the instrument can include a source block coupled to a repellor insulator, a repellor coupled to the repellor insulator, an ion volume insulator coupled to the repellor, a trap insulator coupled to the repellor, a trap coupled to the trap insulator, an ion volume comprising the filament and a first lens, in which the ion volume is coupled to the trap, a second and third lens coupled to the ion volume, and a terminal lens coupled to the second and third lens. In some examples, the instrument source assembly can also include biasing means between the third lens and the terminal lens. In certain examples, the instrument source assembly can include a unitary terminal lens effective to function as a lens and retain the source components in the housing. In additional examples, the instrument source assembly can include means for securing the source assembly in a device. In further examples, the means for securing the source assembly is configured to enable removal of the source assembly without using an insertion/removal tool.

In certain embodiments, the instrument can include a fluid chromatograph fluidically coupled to a mass spectrometer that includes source components in a housing and a terminal lens configured to focus a beam and coupled to the housing, the housing comprising a first set of integral alignment features, the terminal lens and comprising a second set of integral alignment features constructed and arranged to couple to the housing when the first set of integral alignment features are coupled to the second set of integral alignment features to align the terminal lens with the source components in the housing and retain the source components in the housing to provide a source assembly. In some embodiments, one set of the first and second integral alignment features can be configured as pins and the other set of integral alignment features can be configured as slots. In additional embodiments, one set of the first and second integral alignment features can be configured as pins and the other set of integral alignment features can be configured as holes. In other embodiments, one set of the first and second integral alignment features can be configured as hooks and the other set of integral alignment features can be configured as pins. In certain examples, one set of the first and second integral alignment features can be configured as pins and the other set of integral alignment features can be configured as L-shaped slots. In some examples, the set of first integral alignment features includes different alignment features. In other examples, the set of second integral alignment features includes different alignment features. In certain embodiments, the source of the instrument can be an ion source or an electron source. In some embodiments, the set of first integral alignment features can be configured to couple to the second set of integral alignment features in only a single orientation to align the terminal lens with the source components and retain the source components in the housing.

In certain examples, the first set of integral alignment features comprise first, second and third bayonets positioned with substantially equal circumferential spacing on the housing, and the second set of integral alignment features comprise first, second and third L-shaped slots each configured to receive a corresponding one of the first, second and third bayonets of the housing. In some examples, the instrument source assembly is configured to be removed from the mass spectrometer without using an insertion/removal tool. In other examples, the instrument source assembly further comprises a filament in the housing. In additional examples, the instrument source assembly comprises an additional lens between the filament and the terminal lens. In further examples, the instrument source assembly include three lenses between the filament and the terminal lens. In some examples, the instrument source assembly comprises a source block coupled to a repellor insulator, a repellor coupled to the repellor insulator, an ion volume insulator coupled to the repellor, a trap insulator coupled to the repellor, a trap coupled to the trap insulator, an ion volume comprising the filament and a first lens, in which the ion volume is coupled to the trap, a second and third lens coupled to the ion volume, and a terminal lens coupled to the second and third lens. In other examples, the instrument source assembly can include biasing means between the third lens and the terminal lens. In additional examples, the terminal lens of the instrument source assembly can be configured as a unitary lens effective to function as a lens and to align the source components with the terminal lens and retain the source components in the housing. In some examples, the instrument source assembly can include means for securing the source assembly in a device. In further examples, the means for securing the source assembly is configured to enable removal of the source assembly without using an insertion/removal tool.

In certain embodiments, it may be desirable to retrofit existing source assemblies with a terminal lens as described herein. For example, source components can be removed from an existing source assembly and placed into a housing that is designed to couple to a terminal lens. Alternatively, existing housing can be modified or used with inserts designed to couple to a terminal lens as described herein. In such embodiments, the terminal lens can include an integral alignment feature constructed and arranged to couple to a corresponding alignment feature of a housing of a source assembly, the integral alignment feature effective to align the terminal lens with source components in the housing of the source assembly when the integral alignment feature and the corresponding alignment feature of the housing of the source assembly are coupled, the terminal lens further configured to retain the source components in the housing of the source assembly upon coupling of the alignment features.

In certain examples, the integral alignment feature can be configured as a pin, a hole, a hook, a bayonet, an L-shaped slot, or combinations thereof if desired. In some examples, the integral alignment feature of the terminal lens is internal, whereas in other examples, the integral alignment feature of the terminal lens is external. In other examples, the terminal lens is configured to focus a beam comprising ions. In additional examples, the terminal lens is configured to focus a beam comprising electrons.

In other embodiments, it may be desirable to use a terminal lens configured to focus ions or electrons and comprising a set of integral alignment features constructed and arranged to couple to corresponding alignment features of a housing of a source assembly, the integral alignment features effective to align the terminal lens with source components in the housing of the source assembly when the integral alignment features and the corresponding alignment features of the housing of the source assembly are coupled, the terminal lens further configured to retain the source components within the housing of the source assembly upon coupling of the sets of alignment features. Where a terminal lens including a set of alignment features is used, e.g., in an instrument, ion implanter or other device, the set of integral alignment features can be configured as a pin, a hole, a hook, a bayonet, an L-shaped slot or combinations thereof if desired. In some examples, the set of integral alignments features of the terminal lens are internal or are external or some alignment features are internal whereas other alignment features can be external. In certain examples, the terminal lens is configured to focus a beam comprising ions. In additional examples, the terminal lens is configured to focus a beam comprising electrons.

In certain embodiments, a method comprising coupling a first integral alignment feature on a source housing to a second integral alignment feature on a terminal lens operative to focus a beam, the coupling of the alignment features resulting in retention of source components in the source housing and alignment of the source components in the source housing with the terminal lens can be implemented. In some examples, the method can include coupling a pin on the source housing with a slot on the terminal lens to align the source components in the source housing with the terminal lens. In additional examples, the method can include coupling a pin on the source housing with a hole on the terminal lens to align the source components in the source housing with the terminal lens. In further examples, the method can include coupling a hook on the source housing with a pin on the terminal lens to align the source components in the source housing with the terminal lens. In other examples, the method can include coupling a pin on the source housing with an L-shaped slot on the terminal lens to align the source components in the source housing with the terminal lens. In certain examples, the method can include configuring at least one of the first and second integral alignment features to be internal and coupling the alignment features to align the source components in the source housing with the terminal lens. In additional examples, the method can include configuring at least one of the first and second integral alignment features to be external and coupling the alignment features to align the source components in the source housing with the terminal lens. In some examples, the method can include configuring the source as an ion source. In additional examples, the method can include configuring the source as an electron source. In further examples, the method can include configuring the first integral alignment feature to couple the second integral alignment feature in only a single orientation to align the terminal lens with the source components in the source housing.

In other embodiments, a method comprising coupling a first set of integral alignment features on a source housing to a second set of integral alignment features on a terminal lens effective to focus a beam, the coupling of the alignment features resulting in retention of source components in the source housing can be used. In certain embodiments, the method can include coupling pins on the source housing with slots on the terminal lens to align the source components in the source housing with the terminal lens. In additional embodiments, the method can include coupling pins on the source housing with holes on the terminal lens to align the source components in the source housing with the terminal lens. In other embodiments, the method can include coupling hooks on the source housing with pins on the terminal lens to align the source components in the source housing with the terminal lens. In further embodiments, the method can include coupling pins on the source housing with L-shaped slots on the terminal lens to align the source components in the source housing with the terminal lens. In some embodiments, the method can include configuring at least one the first and second sets of integral alignment features to be internal and coupling the sets of alignment features to align the source components in the source housing with the terminal lens. In certain embodiments, the method can include configuring at least one of the first and second sets of integral alignment features to be external and coupling the alignment features to align the source components in the source housing with the terminal lens. In other embodiments, the method can include configuring the source as an ion source or as an electron source. In additional embodiments, the method can include configuring the first integral alignment feature to couple to the second integral alignment feature in only a single orientation to align the terminal lens with the source components and retain the source components in the source housing.

In certain embodiments, a kit comprising a housing constructed and arranged to receive source components, the housing comprising a first integral alignment feature, and a terminal lens constructed and arranged to focus a beam, the terminal lens comprising a second integral alignment feature configured to couple to the first alignment feature of the housing to retain the source components in the housing and to align the terminal lens with the source components can be used in the devices, instruments, methods and systems described herein. In some examples, the terminal lens and housing can be configured to align the source components in the housing when the alignment features of the terminal lens and housing are coupled. In other examples, the kit can include a filament source. In further examples, the kit can include an additional lens. In certain embodiments, the kit can include a repellor.

In certain examples, a kit comprising a housing constructed and arranged to receive source components, the housing comprising a first set of integral alignment features, and a terminal lens constructed and arranged to focus a beam, the terminal lens comprising a second set of integral alignment features configured to couple to the first set of integral alignment features to retain the source components in the housing and align the terminal lens with the source components can be used in the devices, instruments, systems and methods provided herein. In some examples, the terminal lens and housing can be configured to align the source components in the housing when the sets of alignment features of the terminal lens and housing are coupled. In certain embodiments, the kit can include a filament source. In other embodiments, the kit can include an additional lens. In further embodiments, the kit can include a repellor.

In certain embodiments, a method of facilitating assembly of an ion source, the method comprising providing a terminal lens configured to focus a beam, the terminal lens comprising an integral alignment feature that is configured to couple to an integral alignment feature on a housing of the ion source to align the terminal lens with ion source components in the housing and to retain the ion source components in the housing to provide the ion source can be used.

In other embodiments, a method of facilitating assembly of an electron source, the method comprising providing a terminal lens configured to focus a beam, the terminal lens comprising an integral alignment feature that is configured to couple to an integral alignment feature on a housing of the electron source to align the terminal lens with electron source components in the housing and to retain the electron source components in the housing to provide the electron source can be implemented.

In additional embodiments, a method of facilitating assembly of an ion source, the method comprising providing a terminal lens configured to focus a beam, the terminal lens comprising a set of integral alignment features that are configured to couple to a set of integral alignment features on a housing of the ion source to align the terminal lens with ion source components in the housing and to retain the ion source components in the housing to provide the ion source can be used.

In certain examples, a method of facilitating assembly of an electron source, the method comprising providing a terminal lens configured to focus a beam, the terminal lens comprising a set of integral alignment features that are configured to couple to a set of integral alignment features on a housing of the electron source to align the terminal lens with electron source components in the housing and to retain the electron source components in the housing to provide the electron source can be implemented.

In certain embodiments, a tool-less assembly method for assembling source components in a source assembly, the method comprising adding the source components to a housing, and coupling a first integral alignment feature on the housing to a second integral alignment feature on a terminal lens of the source assembly to provide an assembled source assembly without using any tools is provided.

In other embodiments, a tool-less assembly method for assembling source components in a source assembly, the method comprising adding the source components to a housing, and coupling a first set of integral alignment features on the housing to a second set of integral alignment feature on a terminal lens of the source assembly to provide an assembled source assembly without using any tools can be used.

Certain particular configurations are described below to illustrate further some aspects and features of the technology described herein.

EXAMPLE 1

An illustrative configuration of an ion source or an electron source is described below with reference to the exploded view shown in FIG. 6. The source 600 includes an ion volume 603 where a sample to be analyzed is ionized using a filament 612 or by a chemical that is injected through a hole (not shown). The ionized sample is accelerated though the device by magnetic and/or electric forces from my a magnetic field and a repellor 602, which typically carries an opposing electrical potential to that of the ionized sample such that an ion beam including any sample is sent downstream toward the lenses 607, 608*b*, 608*c* and the terminal lens 610. A repellor insulator 602*a* is typically adjacent to the repellor 602. The lenses 607, 608*b*, 608*c* and 610 are operative to direct and focus the ion beam as the ion beam passes through them. Electrical insulators 601, 605 and 608*a* are present to electrically isolate the various source components from each other and from a source block 604 in the source housing 606, which is configured to receive the various components of the source 600. The housing 606 is typically electrically grounded. A spring 609 compresses and forces the source components together into the correct axial position and assist in maintaining the correct position of the components with the housing 606. In the illustration shown in FIG. 6, the housing 606 can include three bayonet pins which protrude radially from the outer surface of the housing 606. The terminal lens 610 can include three corresponding slots configured to receive the three pins of the housing 606 such that engagement of the pings in the slots results in proper alignment of the source components in the housing 606 and acts to retain coupling of the housing 606 and the terminal lens 610. If desired, the pins and slot can each be configured such that the terminal lens 610 will couple to the housing 606 in only a single orientation, e.g., by having the pins and slots radially positioned so the corresponding angles align only in a single orientation. The source can include electrical couplings (not shown) to facilitate placement of a desired voltage or current on the source components.

Figure 6:
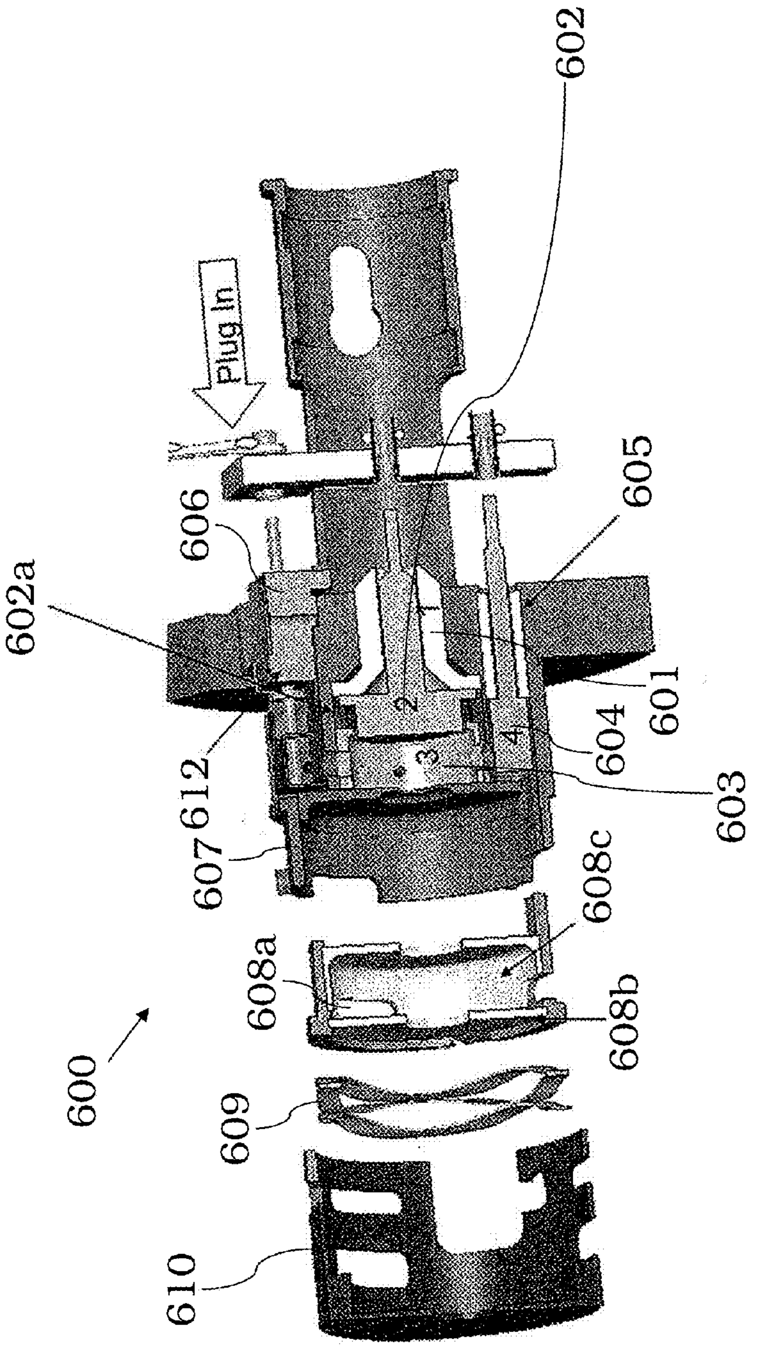
FIG. 6 is an exploded view of an illustrative source, in accordance with certain examples.

To assemble the components shown in FIG. 6, the terminal lens 610 is moved toward the housing 606 until the pins of the housing 606 couple to the channels of the slots of the terminal lens. The terminal lens 610 is then rotated clockwise (when the source 600 is viewed on end with the terminal lens 610 being closest to the viewer) to couple the terminal lens to the housing and align the centerline of the source components. To disassemble the source 600 for cleaning, for example, the terminal lens 610 is rotated counterclockwise and the terminal lens 610 is moved away from the housing 606. If desired, the pins and slots may be configured in an opposite direction such that counterclockwise rotation couples the housing 606 and the terminal lens 610 and clockwise rotation releases the housing 606 from the terminal lens 610.

EXAMPLE 2

During operation of a gas chromatograph-mass spectrometer (GC-MS) including the source shown in FIG. 6, the following parameters can be used: 100 microAmperes filament emission (trap) current, 200 microAmperes filament source (body) current, 1.5 Amperes filament current, a repellor voltage of 1.0 Volts, a voltage of 4 Volts for lens 1, a voltage of 100 volts for lens 2, an ion energy of 1 Volt and an ion energy ramp of 1 Volt.

EXAMPLE 3

Figure 7:
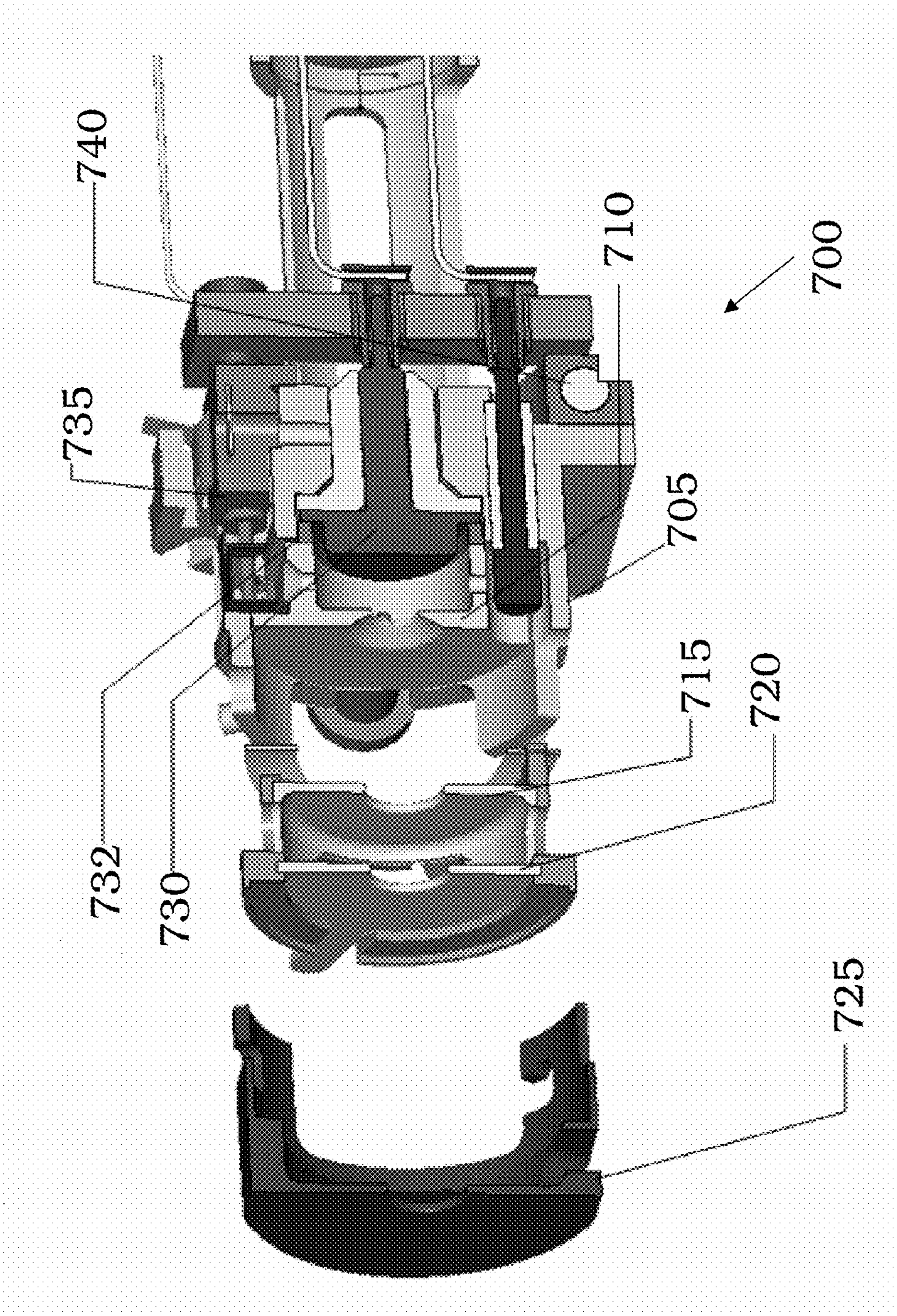
FIG. 7 is an illustration of another source, in accordance with certain examples.

Another configuration of an ion source or an electron source is described below with reference to FIGS. 7-9. The source 700 includes a housing 705 that is constructed and arranged to include a combined ion volume/lens 710. The source 700 also includes lenses 715 and 720 and a terminal lens 725, which can include one or more of the alignment features, e.g., bayonets, configured to couple to alignment features on the housing 705. The source can also include a repellor 730, a repellor insulator 732, a filament 735 and a heater 740.

Figure 8B:
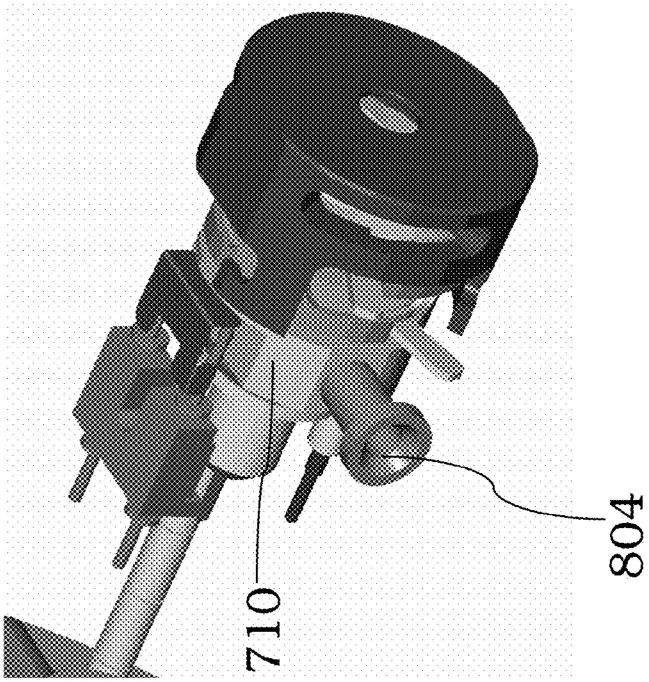
FIGS. 8A and 8B are illustrations showing an alignment pin present on a combined ion volume/lens, in accordance with certain examples.
Figure 8A:
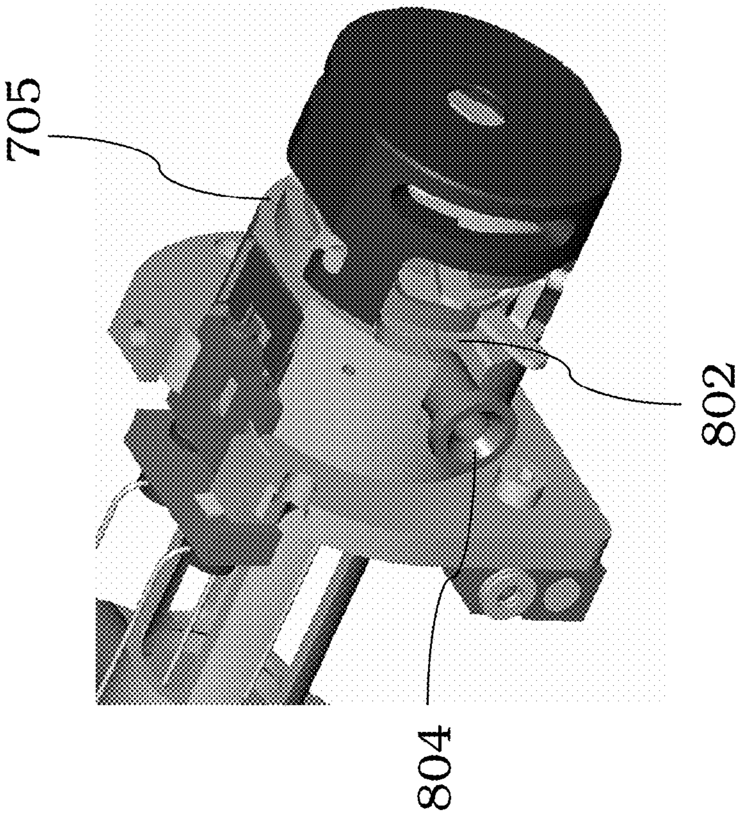

A close up view of the combined ion volume/lens 710 is shown in FIGS. 8A and 8B. The ion volume/lens 710 includes an alignment pin 804 that engages a slot 802 in the housing 705. The alignment pin 804 is operative to align the ion volume apertures rotationally with the filament and/or trap. FIG. 8B shows a view where the housing has been removed. The alignment pin 804 is pressed into the ion volume 710 such that it is integrally attached thereto and generally not removable without damaging the ion volume 710. If desired, however, the ion volume 710 can include internal threads configured to mate to an external alignment pin that is coupled to the ion volume 710 prior to assembly of the source 700.

Figure 9:
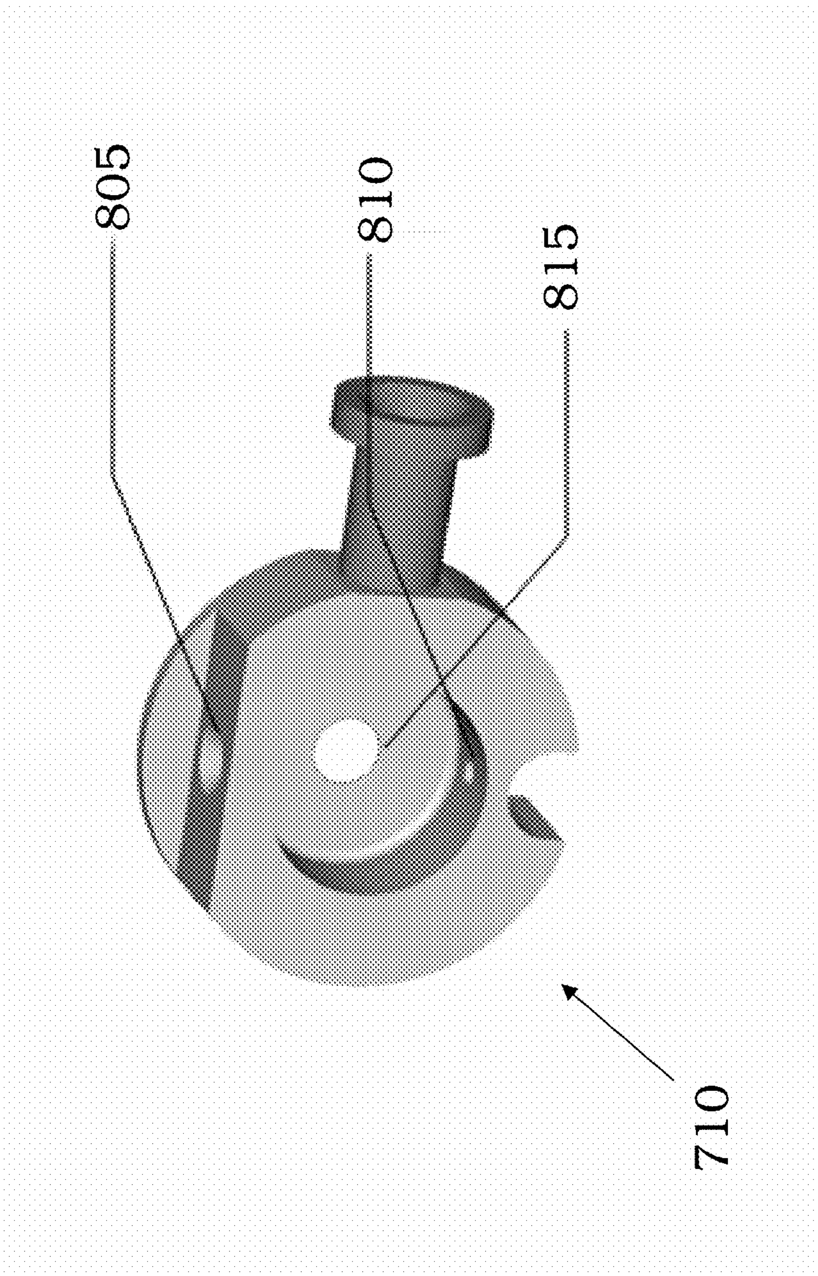
FIG. 9 is an illustration showing the combined ion volume/lens, in accordance with certain examples.

A more detailed view of the ion volume/lens component 710 is shown in FIG. 9. The ion volume/lens 710 includes an aperture 905 for a filament, an aperture 910 for a trap (if used) and a lens 915. The lens 915 can be considered "lens 0" as it is closest to the filament.

When introducing elements of the examples disclosed herein, the articles "a," "an," "the" and "said" are intended to mean that there are one or more of the elements. The terms "comprising," "including" and "having" are intended to be open-ended and mean that there may be additional elements other than the listed elements. It will be recognized by the person of ordinary skill in the art, given the benefit of this disclosure, that various components of the examples can be interchanged or substituted with various components in other examples.

Although certain aspects, examples and embodiments have been described above, it will be recognized by the person of ordinary skill in the art, given the benefit of this disclosure, that additions, substitutions, modifications, and alterations of the disclosed illustrative aspects, examples and embodiments are possible.

What is claimed is:

1. A source assembly comprising:

a housing configured to receive source components, the housing comprising a first integral alignment feature; and a terminal lens configured to provide a beam, the terminal lens comprising a second integral alignment feature, the terminal lens constructed and arranged to couple to the housing when the first integral alignment feature is coupled to the second integral alignment feature to align the terminal lens with the source components in the housing and retain the source components in the housing.

2. The source assembly of claim 1, in which one of the first and second integral alignment features comprises a pin and the other integral alignment feature comprises a slot.

3. The source assembly of claim 1, in which one of the first and second integral alignment features comprises a pin and the other integral alignment feature comprises a hole.

4. The source assembly of claim 1, in which one of the first and second integral alignment features comprises a hook and the other integral alignment feature comprises a pin.

5. The source assembly of claim 1, in which one of the first and second integral alignment features comprises a pin and the other integral alignment feature comprises a L-shaped slot.

6. The source assembly of claim 1, in which at least one of the first and second integral alignment features are internal.

7. The source assembly of claim 1, in which at least one of the first and second integral alignment features are external.

8. The source assembly of claim 1, in which the terminal lens is configured to provide a beam comprising ions.

9. The source assembly of claim 1, in which the terminal lens is configured to provide a beam comprising electrons.

10. The source assembly of claim 1, in which the first integral alignment feature is configured to couple to the second integral alignment feature in only a single orientation to align the terminal lens with the source components and retain the source components in the housing.

11. The source assembly of claim 1, in which the first integral alignment feature comprises first, second and third bayonets positioned with substantially equal circumferential spacing on the housing, and the second integral alignment feature comprises first, second and third L-shaped slots each configured to receive a corresponding one of the first, second and third bayonets of the housing.

12. The source assembly of claim 1, in which the source assembly is configured to be removed from a mass spectrometer without using an insertion/removal tool.

13. The source assembly of claim 1, in which the source assembly further comprises a filament in the housing.

14. The source assembly of claim 13, in which the source assembly comprises an additional lens in the housing.

15. The source assembly of claim 14, further comprising three lenses between the filament and the terminal lens.

16. The source assembly of claim 15, in which the source assembly comprises:

a source block coupled to a repellor insulator;

a repellor coupled to the repellor insulator;

an ion volume insulator coupled to the repellor;

an trap insulator coupled to the repellor;

an trap coupled to the trap insulator;

an ion volume comprising the filament and a first lens, in which the ion volume is coupled to the trap;

a second and third lens coupled to the ion volume; and the terminal lens is coupled to the second and third lens.

17. The source assembly of claim 16, further comprising biasing means between the third lens and the terminal lens.

18. The source assembly of claim 1, further comprising configuring the terminal lens as a unitary lens effective to function both as a lens and to retain source components in the housing.

19. The source assembly of claim 1, further comprising means for securing the source assembly in a device.

20. The source assembly of claim 19, in which the means for securing the source assembly is configured to enable removal of the source assembly without using an insertion/removal tool.

21. A source assembly comprising:

a housing configured to receive source components and comprising a first set of integral alignment features;

a terminal lens constructed and arranged to provide a beam, the terminal lens comprising a second set of integral alignment features, the terminal lens constructed and arranged to couple to the housing when the first set of integral alignment features are coupled to the second set of integral alignment features to align the terminal lens with the source components in the housing and retain the source components in the housing.

22. The source assembly of claim 21, in which one set of the first and second integral alignment features comprises pins and the other set of integral alignment features comprises slots.

23. The source assembly of claim 21, in which one set of the first and second integral alignment features comprises pins and the other set of integral alignment features comprises holes.

24. The source assembly of claim 21, in which one set of the first and second integral alignment features comprises hooks and the other set of integral alignment features comprises pins.

25. The source assembly of claim 21, in which one set of the first and second integral alignment features comprises pins and the other set of integral alignment features comprises L-shaped slots.

* * * * *